(12) United States Patent
Mao et al.

(10) Patent No.: US 7,802,354 B2
(45) Date of Patent: Sep. 28, 2010

(54) METHOD OF MANUFACTURING SUPPORT STRUCTURE FOR OPEN MRI

(75) Inventors: Jian Mao, Huntington, WV (US); Jian Min Wang, Shanghai (CN); Heng Liu, Xi'an (CN); Anbo Wu, Shanghai (CN)

(73) Assignee: General Electric Company, Niskayuna, NY (US)

( * ) Notice: Subject to any disclaimer, the term of this patent is extended or adjusted under 35 U.S.C. 154(b) by 451 days.

(21) Appl. No.: 12/039,647

(22) Filed: Feb. 28, 2008

(65) Prior Publication Data

US 2008/0201930 A1 Aug. 28, 2008

Related U.S. Application Data

(62) Division of application No. 10/878,584, filed on Jun. 28, 2004, now Pat. No. 7,631,411.

(51) Int. Cl.
*B23P 17/00* (2006.01)
*B23P 21/00* (2006.01)

(52) U.S. Cl. ..................... 29/525.01; 29/469

(58) Field of Classification Search .............. 29/525.01, 29/428, 469, 458, 432, 505, 524.1, 521, 525.14, 29/607, 602.1, 462; 324/319; 600/407, 410
See application file for complete search history.

(56) References Cited

U.S. PATENT DOCUMENTS

| | | | |
|---|---|---|---|
| 6,150,819 A | 11/2000 | Laskaris et al. | |
| 6,365,894 B2 * | 4/2002 | Tadokoro et al. | 250/298 |
| 6,518,867 B2 | 2/2003 | Laskaris et al. | |
| 6,525,634 B2 | 2/2003 | Laskaris et al. | |
| 6,657,527 B2 | 12/2003 | Elgin et al. | |
| 6,662,434 B2 | 12/2003 | Laskaris et al. | |
| 6,664,878 B1 | 12/2003 | Chen et al. | |
| 6,694,602 B2 | 2/2004 | Laskaris et al. | |
| 6,799,366 B2 | 10/2004 | Tsuda | |
| 6,889,070 B2 | 5/2005 | Tsuda | |
| 2001/0005165 A1 | 6/2001 | Laskaris et al. | |
| 2002/0021129 A1 | 2/2002 | Laskaris et al. | |

FOREIGN PATENT DOCUMENTS

EP 0860707 8/1998

* cited by examiner

*Primary Examiner*—John C Hong
(74) *Attorney, Agent, or Firm*—Fletcher Yoder, PC

(57) ABSTRACT

A multi-layered support structure of an open magnetic resonance imaging (MRI) system, configured to provide high permeability to a magnetic flux from a source of a magnetic field, includes a first multi-layered support structure, a second multi-layered support structure and at least one third support structure, connecting the first multi-layered support structure and the second multi-layered structure.

14 Claims, 12 Drawing Sheets

METHOD OF MANUFACTURING SUPPORT STRUCTURE FOR OPEN MRI

CROSS REFERENCE TO RELATED APPLICATIONS

This application is a Divisional of U.S. patent application Ser. No. 10/878,584, entitled "Support Structure for Open MRI and Method and System Thereof", filed Jun. 28, 2004, which is herein incorporated by reference.

BACKGROUND

The present invention relates generally to magnetic resonance imaging (MRI) systems and specifically to support structures of a magnetic resonance imaging system.

MRI systems are widely used in medical community as a diagnostic tool for imaging tissue and organ structures in a subject. MRI systems establish a primary magnetic field, and a series of gradient fields that influence gyro magnetic materials in the subject to be imaged. During imaging, gradient fields are pulsed in accordance with predetermined imaging protocols, and a radio frequency field causes motion of molecules of the gyro magnetic materials. Signals resulting from realignment of the molecules are then detected and processed to reconstruct useful images of the subject. MRI magnet designs include closed magnets and open magnets.

Closed magnets typically have a single, tubular-shaped bore in which the subject, typically a patient in a medical context, may be positioned for imaging. Open magnet designs, including "C" or "U" shaped magnets, typically employ two magnet assemblies separated by a space from one another, with the space between the magnet assemblies defining an imaging volume. The patient is positioned in the imaging volume for imaging. In open MRI systems, the space between the magnet assemblies aids certain patients in remaining comfortable during examinations as opposed to closed or tubular magnet designs. The magnet assemblies, that are positioned apart, also allow for access by medical personnel for surgery or any other medical procedure during magnetic resonance imaging.

In these open MRI systems, permanent magnets are directly attached to a support structure. In currently employed MRI systems, the support structure is made by hot rolling, forging or casting along with extensive machining processes. Excess material is generally removed by such machining processes. In current designs, a substantial volume of material is removed in this manner, with thicker sections being left towards a rear edge and thinner sections being formed near front, typically cantilevered areas. Effective material usage in typical current designs is about 60-65%. Thus the current designs increase material costs due to raw material used as well as the material removed. The current designs also increase manufacturing costs due to the machining processes.

Thus, there exists a need for improved designs for the support structure of open MRI system magnets, and corresponding manufacturing processes, which can reduce costs, while providing high quality and uniform fields needed for imaging.

BRIEF DESCRIPTION

Briefly, in accordance with one aspect of present technique, a multi-layered support structure is provided for an open magnetic resonance imaging (MRI) system, configured to provide high permeability to a magnetic flux from a source of a magnetic field. The multi-layered support structure includes a first multi-layered support structure and a second multi-layered support structure. The multi-layered support structure also includes a third support structure, connecting the first multi-layered support structure and the second multi-layered structure for supporting at least two magnetic assemblies. An imaging volume is formed between the two magnetic assemblies. The multi-layered support structure is further configured to provide high quality and uniform magnetic fields needed for imaging.

In accordance with another aspect of the present technique, a method of manufacturing a multi-layered support structure of an open MRI system is provided. The method generally includes constructing a plurality of structures and coupling the plurality of structures. The plurality of structures includes a first multi-layered support structure, a second multi-layered support structure and a third support structure. The third support structure ties the multi-layered structured together in the final assembly.

In accordance with another aspect of the present technique, a method of manufacturing a multi-layered support structure of an open MRI system is provided. The multi-layered support structure is configured to provide uniform magnetic fields for imaging. The method includes adjusting at least one of the gaps between a plurality of layers in the multi-layered support structure of the open MRI system.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The present technique is directed towards a support structure for an open magnetic resonance imaging (MRI) system. In general the support structure is configured to house a pair of magnet assemblies in the open MRI system. In the context of the present technique, a multi-layered support structure is used to reduce material and manufacturing costs and to provide a uniform magnetic field for imaging by adjusting a magnetic field of the system. As will be appreciated by those of ordinary skill in the art, the present techniques may also be applied in other medical and non-medical contexts.

Figure 1:
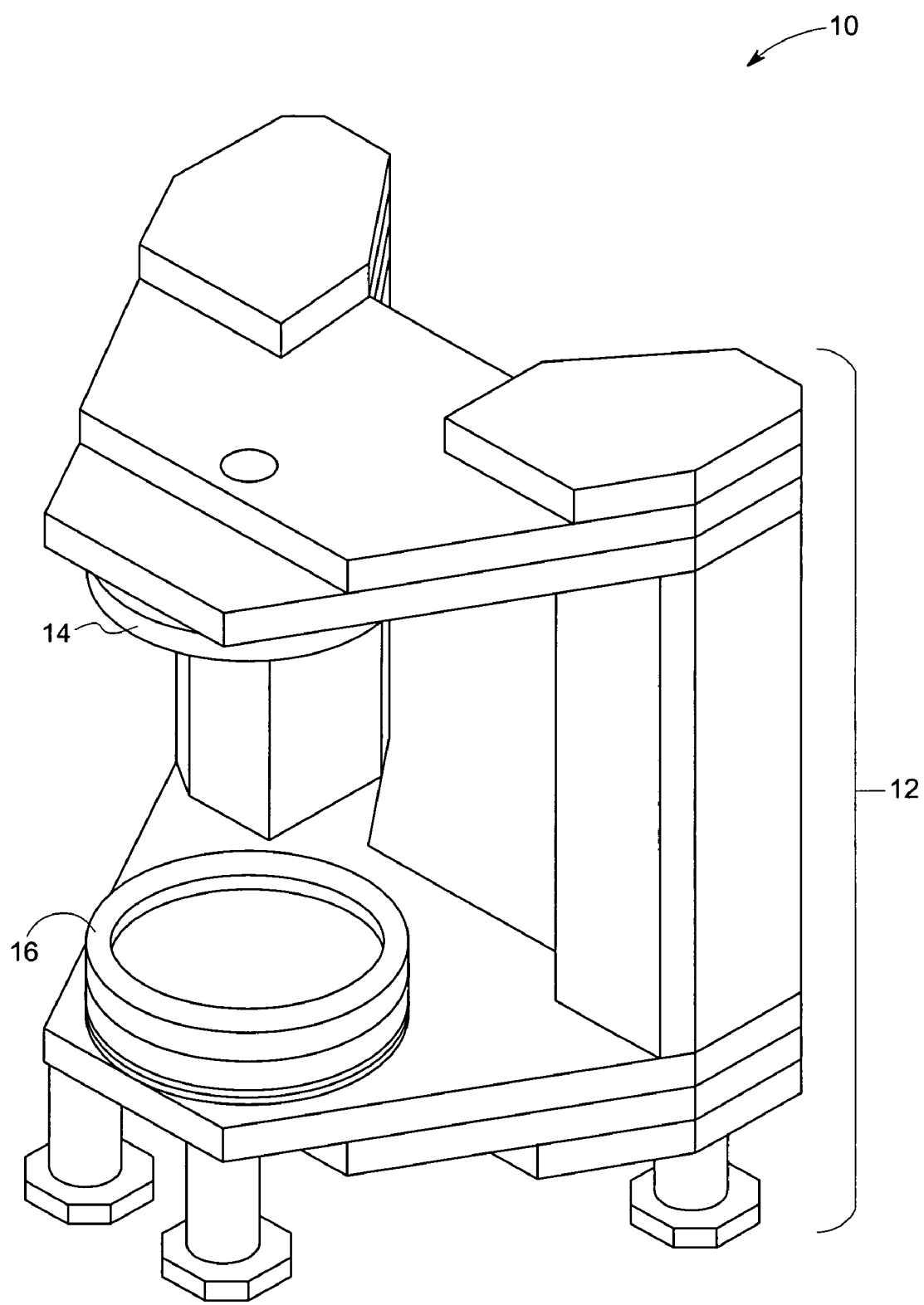
FIG. 1 is a perspective view of a magnet structure for an open MRI system in accordance with aspects of present technique.

Turning now to the drawings, and referring first to FIG. 1, an exemplary embodiment of an open MRI system 10 is illustrated diagrammatically in conjunction with the present technique. As depicted, the open MRI system 10 includes a multi-layered support structure 12 (which will be discussed in greater detail in later sections) and at least two magnet assemblies, a first magnet assembly 14 and a second magnet assembly 16. An imaging volume is formed between the magnet assemblies. The multi-layered support structure is configured to provide high permeability to a magnetic flux from a source of magnetic field. In a medical context, a patient is positioned in the imaging volume for imaging. In other contexts, and more generally, a subject of interest is disposed in the imaging volume for acquisition of image data during an examination. An open space between the magnet assemblies helps the patient overcome any feeling of claustrophobia that may be experienced in a closed magnet design. The open MRI system also allows for access by medical personnel for surgery or other medical procedure during magnetic resonance imaging. The open MRI system 10 may be of any suitable type or rating, including open MRI systems varying from 0.2 Tesla ratings to 1 Tesla ratings and beyond.

Figure 2:
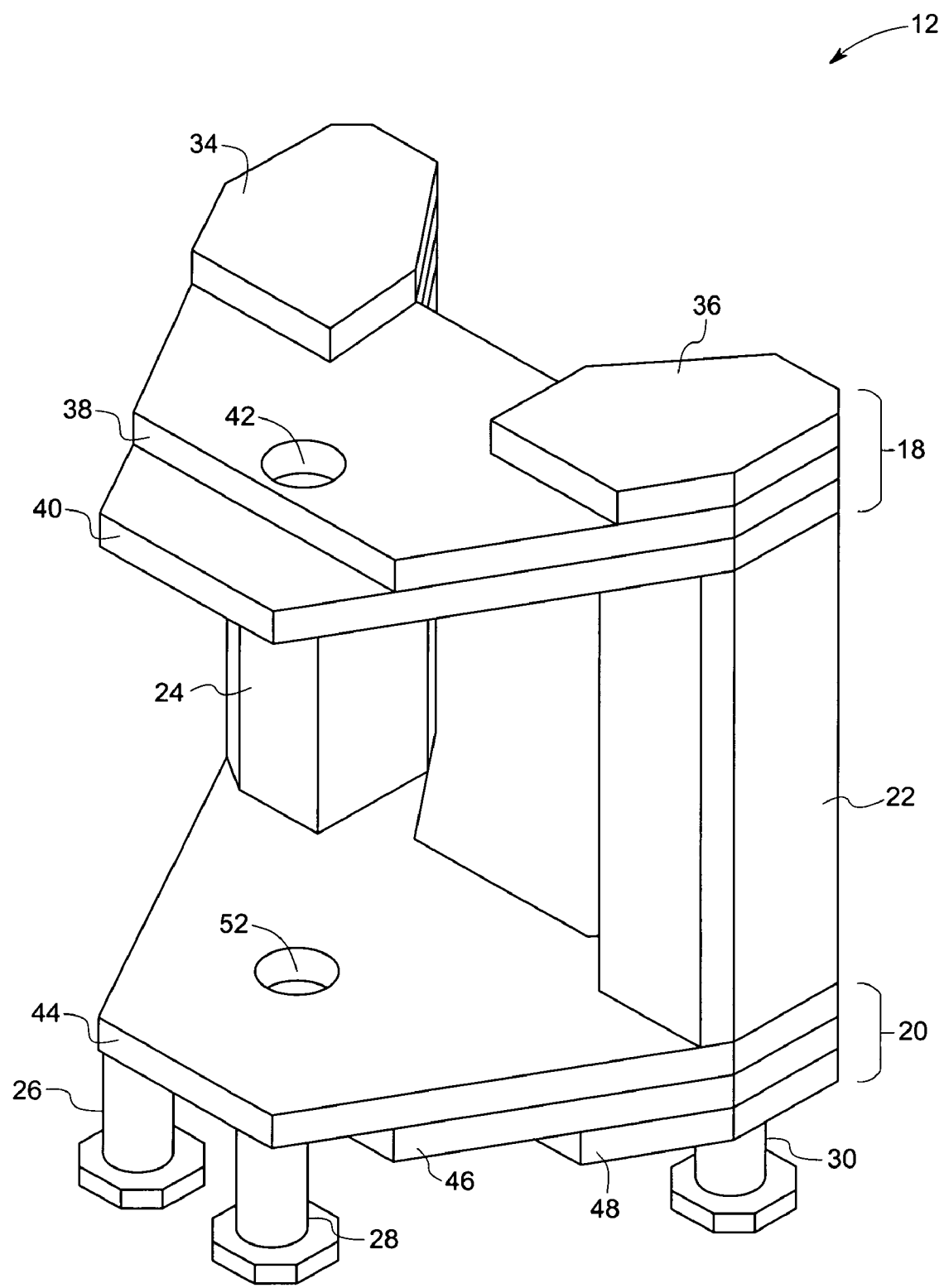
FIG. 2 is a perspective view of a three-layered magnet support structure of the type shown in FIG. 1.

FIG. 2 illustrates the multi-layered support structure 12 comprising a first three-layered support structure 18, a second three-layered support structure 20, third support structures 22, 24, connecting the first three-layered structure and the second three-layered structure. The multi-layered support structure 12 also comprises legs 26, 28, 30 and 32, the latter leg not being visible in FIG. 2.

The first three-layered support structure 18 comprises a first layer of low carbon steel plates 34, 36, a second layer of low carbon steel plate 38 and a third layer of low carbon steel plate 40 which are coupled by at least one of fasteners, rivets, adhesives, weldments and combinations thereof. The first three-layered support structure 18 also comprises a hole or recess 42 for a magnet assembly, not shown in FIG. 2. The second three-layered support structure 20 comprises a first layer of low carbon steel plate 44, a second layer of low carbon steel plates 46 and a third layer of low carbon steel plates 48, 50, the latter plate not being visible in FIG. 2, which are coupled by at least one of fasters, rivets, adhesives, weldments and combinations thereof. The second three-layered support structure 20 also comprises a hole or recess 52 for a magnet assembly (not shown in FIG. 2).

The first three-layered support structure 18 and the second three-layered support structure 20 are coupled to the third support structures 22 and 24 by at least one of fasters, rivets, adhesives, weldments and combinations thereof. The third support structures 22 and 24 comprise at least one of a plate, a pillar, a post and combinations thereof made from low carbon steel. The legs 26, 28, 30 and 32 are coupled to a lower side of the second three-layered support structure by at least one of fasters, rivets, adhesives, weldments and combinations thereof. The multi-layered support structure 12 may further include a device to provide an adjustment to the magnetic field produced in the MRI system, as described more fully below.

Figure 3:
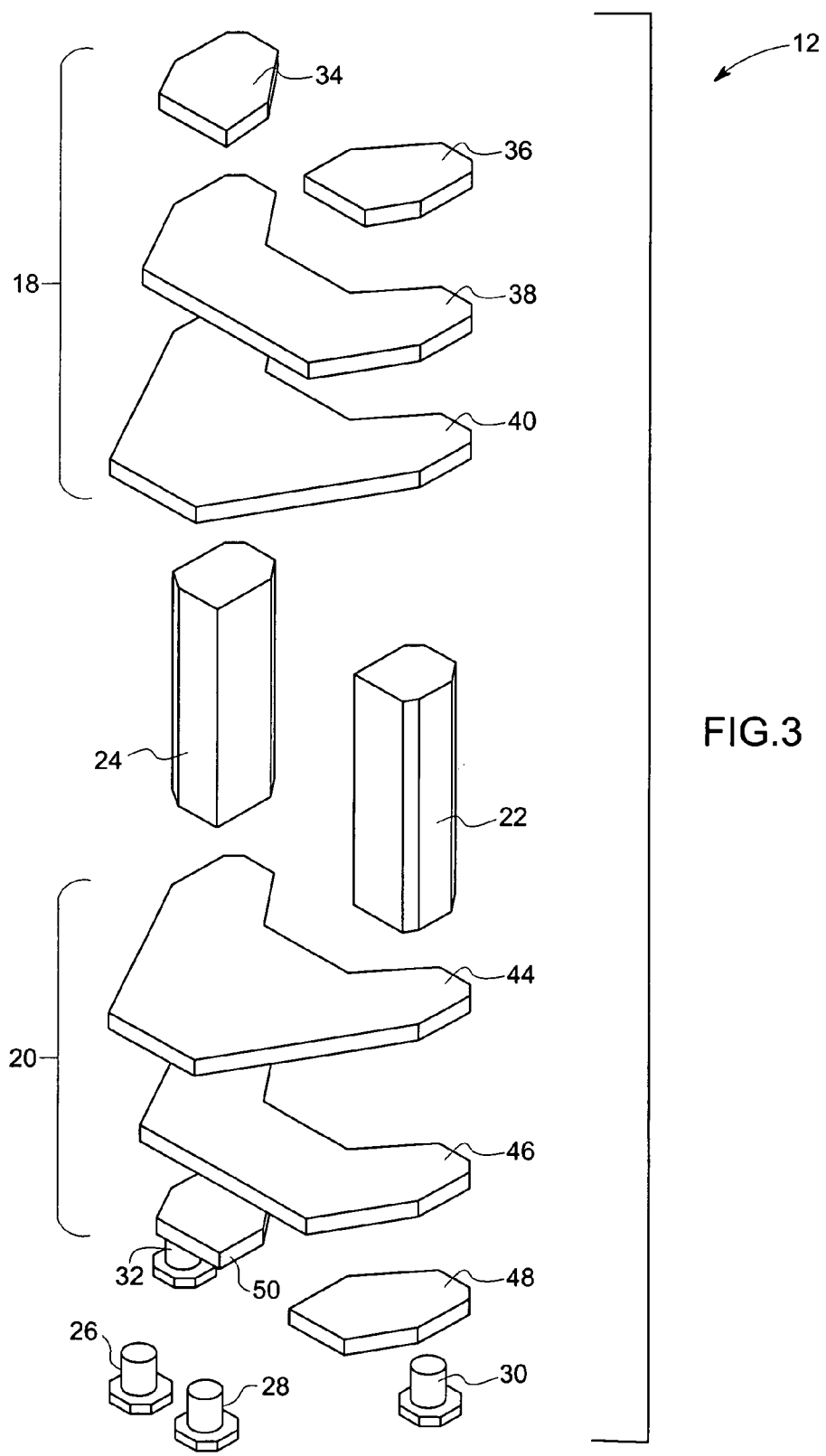
FIG. 3 is an exploded perspective view of the three-layered support structure of FIG. 2.

FIG. 3 is an exploded view of the multi-layered support structure 12 as explained in detail above. As can be seen in FIG. 3, the layers of plate making up the upper and lower support structures may be separate pieces of material formed to be assembled into the final structure. Those skilled in the art will recognize, then, that the multi-layered support structures may be effectively contoured (e.g. in a step-wise manner) to provide the desired mechanical support and channeling of magnetic flux, while avoiding costly provision of excess material or time-consuming and costly machining of thicker plate material to reduce weight.

Figure 4:
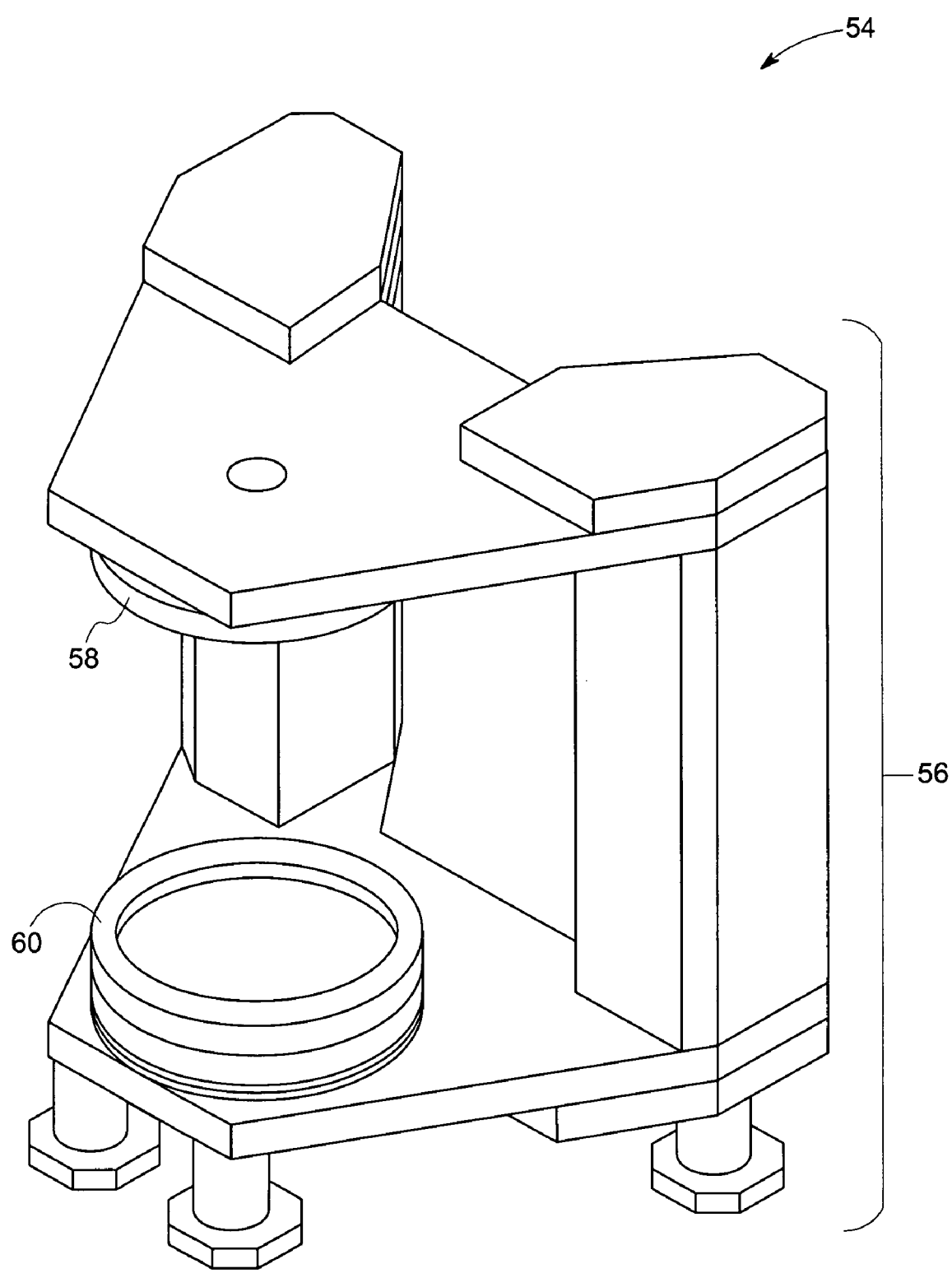
FIG. 4 is a perspective view of a magnet structure for an open MRI system in accordance with aspects of present technique.

FIG. 4 illustrates another exemplary embodiment of an open MRI system 54, which comprises a multi-layered support structure 56 at least two magnet assemblies, a first magnet assembly 58 and a second magnet assembly 60. The multi-layered support structure 56 (which will be discussed in greater detail in later sections) is configured to provide high permeability to a magnetic flux generated by a source of a magnetic field, such as a superconducting magnet and/or a permanent magnet arrangement.

Figure 5:
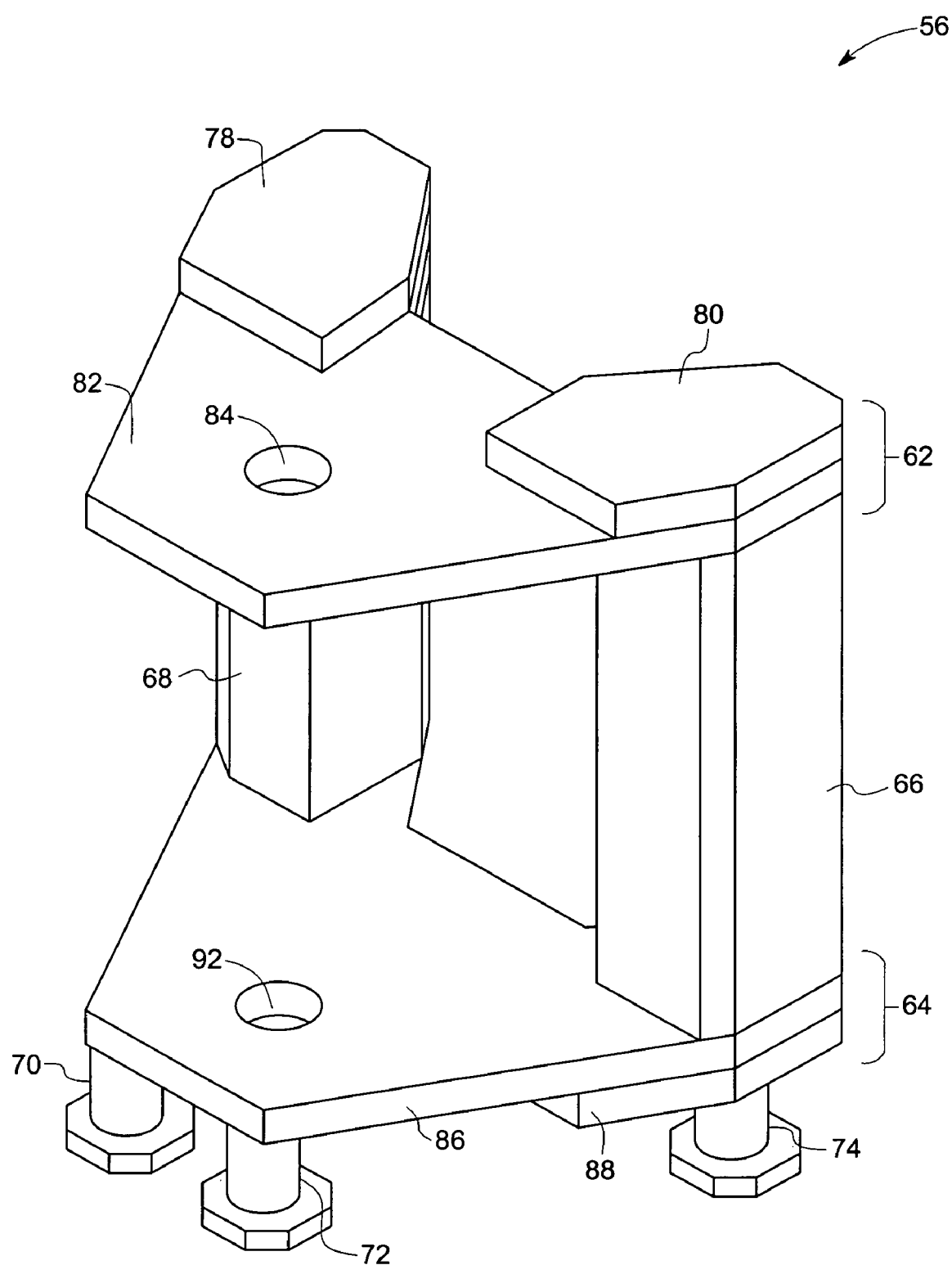
FIG. 5 is a perspective view of a two-layered magnet support structure of the type shown in FIG. 4.

FIG. 5 illustrates the multi-layered support structure 56 which comprises a first two-layered support structure 62, a second two-layered support structure 64, and third support structures 66 and 68, connecting the first two-layered structure and the second two-layered structure. The multi-layered support structure 56 also comprises legs 70, 72, 74 and 76 (leg 76 not being shown in FIG. 5).

The first two-layered support structure 62 comprises a first layer of low carbon steel plates 78 and 80 and a second layer of low carbon steel plate 82. As in the former embodiment, the plates may be coupled to one another at least one of fasters, rivets, adhesives, weldments and combinations thereof. The first two-layered support structure 62 also comprises a hole or recess 84 for a magnet assembly (not shown in FIG. 5).

The second two-layered support structure 64 comprises a first layer of low carbon steel plate 86 and a second layer of low carbon steel plates 88 and 90, the latter plate not being visible in FIG. 5. Here again, the plates of the lower support structure are coupled to one another by at least one of fasters, rivets, adhesives, weldments and combinations thereof. The second two-layered support structure 64 also comprises a hole or recess 92 for a magnet assembly (not shown in FIG. 5). The first two-layered support structure 62 and the second two-layered support structure 64 are coupled to the third support structures 66, 68 by at least one of fastening, riveting, gluing, welding and combinations thereof. The third support structures 66 and 68 comprise at least one of a plate, a pillar, a post and combinations thereof made from low carbon steel. The legs 70, 72, 74 and 76 are coupled to a lower side of the second two-layered support structure by at least one of fasters, rivets, adhesives, weldments and combinations thereof. The multi-layered support structure 56 may further include a device to provide an adjustment of the magnetic field of the system, as described below.

It should be noted that while low carbon steel is described herein for the construction material of the support structures, the particular material used may be subject to design choice. For example, various steels, and indeed other materials may be appropriate for the particular application. In many contexts, however, the structures will be relied upon for transmission of magnetic fields, and their magnetic properties may be important to the ultimate system operation.

Figure 6:
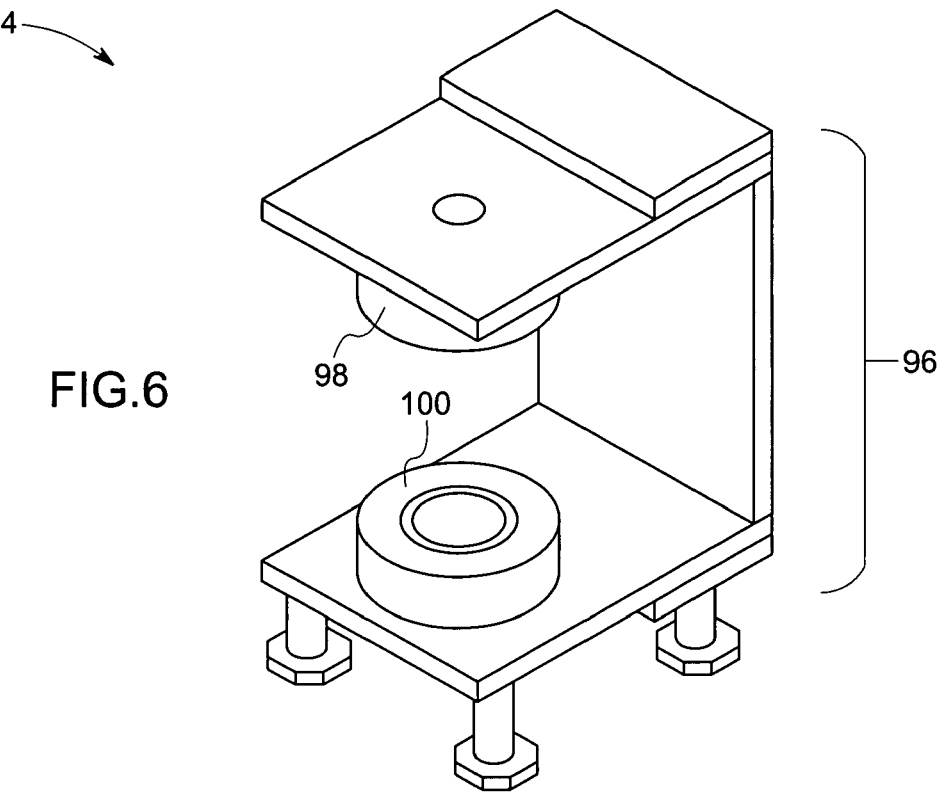
FIG. 6 is a perspective view of a magnet structure for an open MRI system with a C-shaped support structure in accordance with aspects of present technique.

FIG. 6 illustrates yet another exemplary embodiment of an open MRI system 94, which comprises a multi-layered C-shaped support structure 96 and at least two magnet assemblies, a first magnet assembly 98 and a second magnet assembly 100. The multi-layered C-shaped support structure 96 (which will be discussed in greater detail in later sections) is configured to provide high permeability to a magnetic flux from a source of a magnetic field, as described above.

Figure 7:
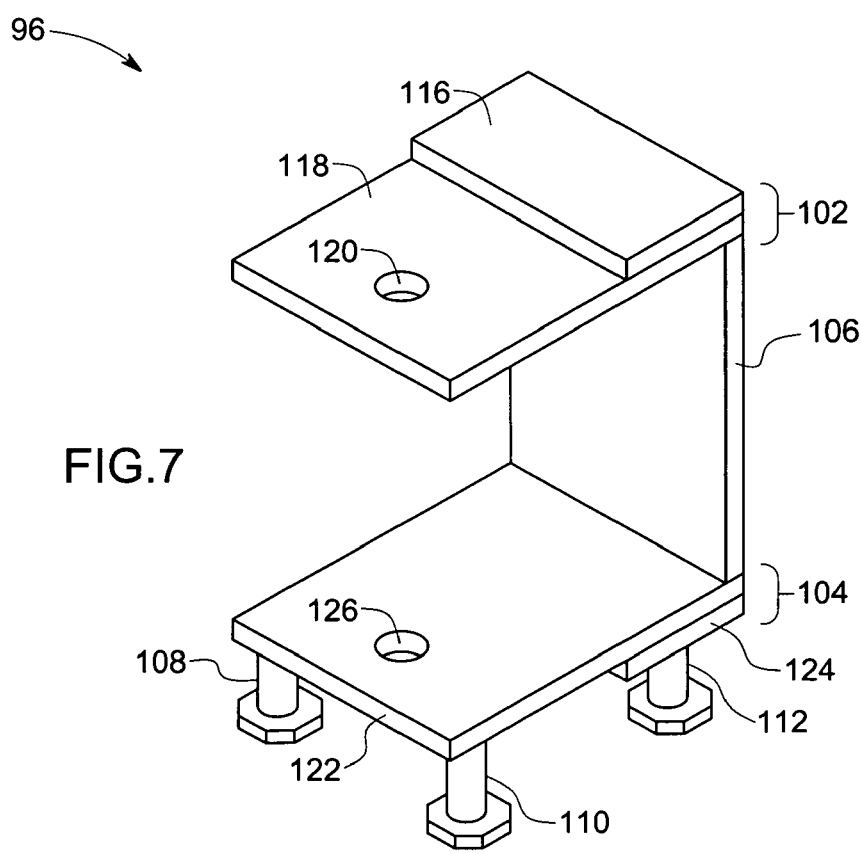
FIG. 7 is a perspective view of the two-layered C shaped support structure of the type shown in FIG. 6.

FIG. 7 illustrates an alternative configuration for the multi-layered C-shaped support structure 96. Again, structure 96 includes a first two-layered support structure 102, a second two-layered support structure 104, and a third support structure 106, connecting the first two-layered structure and the second two-layered structure. The multi-layered C-shaped support structure 96 also comprises legs 108, 110, 112 and 114, the latter leg not being visible in FIG. 7.

The first two-layered support structure 102 comprises a first layer of low carbon steel plate 116 and a second layer of low carbon steel plate 118. The plates are coupled to one another by at least one of fasteners, rivets, adhesives, weldments and combinations thereof. The first two-layered support structure 102 also comprises a hole or recess 120 for a magnet assembly (not shown in FIG. 7). The second two-layered support structure 104 comprises a first layer of low carbon steel plate 122 and a second layer of low carbon steel plate 124 (not shown in FIG. 7) which are joined by at least one of fasteners, rivets, adhesives, weldments and combinations thereof. The second two-layered support structure 104 also comprises a hole or recess 126 for a magnet assembly (not shown in FIG. 7). The first two-layered support structure 102 and the second two-layered support structure 104 are coupled to the third support structure 106 by an assembling means, such as at least one of fasteners, rivets, adhesives, weldments and combinations thereof. The legs 108, 110, 112 and 114 are coupled to a lower side of the second two-layered support structure by a similar assembling means. The multi-layered support structure 96 may further include an arrangement for providing adjustment of the magnetic field, as described below.

Figure 8:
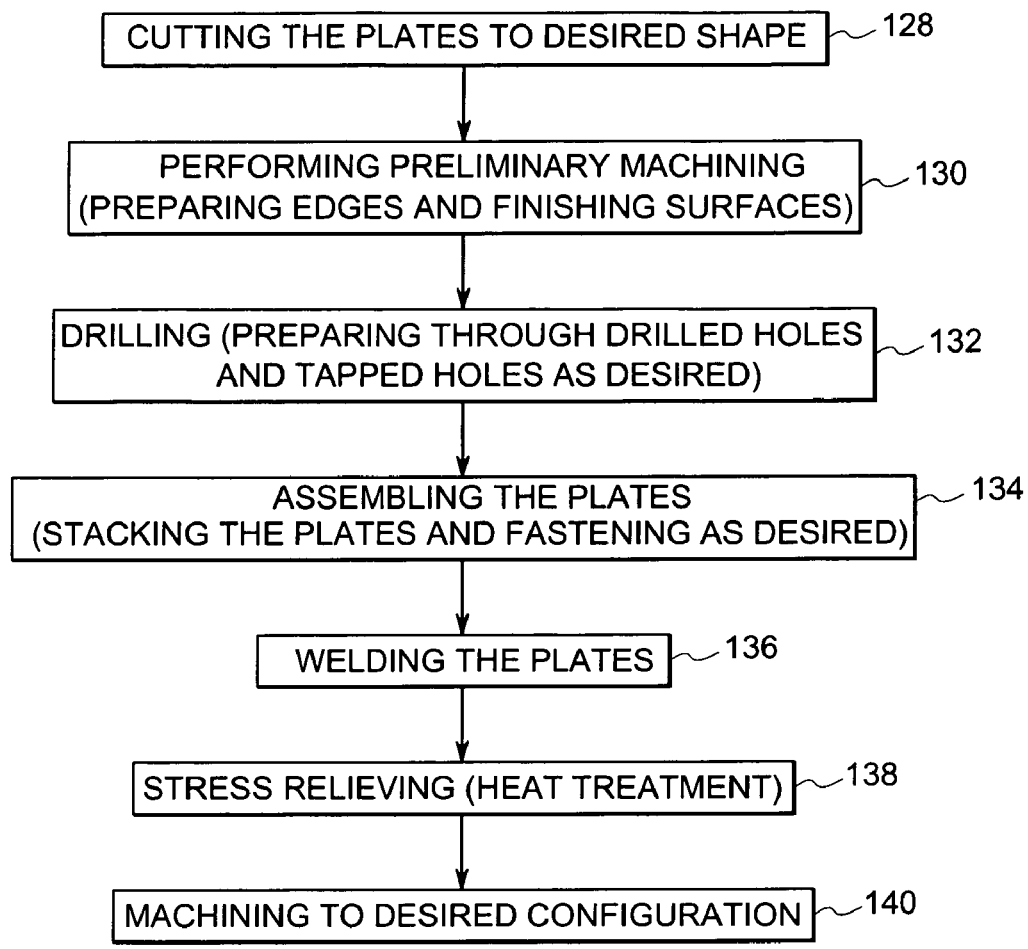
FIG. 8 is a diagrammatic illustration of an exemplary method of manufacturing of a multi-layered support structure in accordance with aspects of present technique.

FIG. 8 illustrates an exemplary method for manufacturing a multi-layered support structure for an open MRI system in accordance with aspects of the present technique. The process generally begins with cutting a plurality of plates to a desired shape, as indicated at step 128. Preliminary machining may then be performed, as indicated at step 130, such as to prepare edges and surfaces. In a present embodiment, then, a plurality of through-drilled holes is formed through the plates, as well as a plurality of tapped holes, as indicated at step 132. With the plates and supports thus prepared, they are assembled by stacking and fastening, as indicated at step 134. In one present embodiment, the plates are then welded, as indicated at step 136. Where such welding is used to join these members, stress relieving through heat treatment may be performed, as indicated at step 138. Such heat treatment serves to relieve stresses due to welding. Finally, machining operations may be performed to provide a desired final configuration, as indicated at step 140. Such operations may include drilling or milling operations, including forming a plurality of holes for magnet assemblies.

Figure 9:
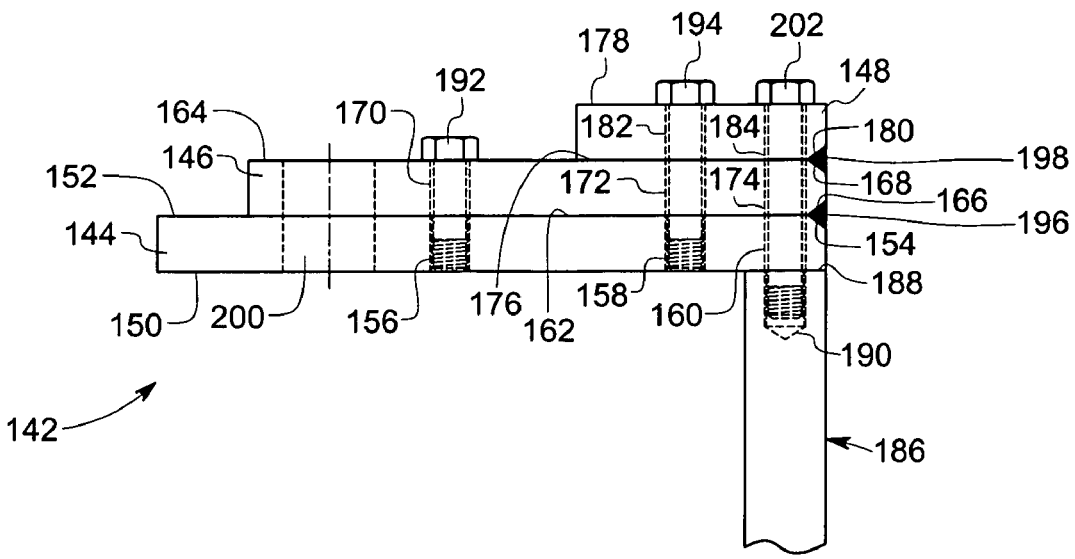
FIG. 9 is a front cross-sectional view of a bolted and welded top multi-layered support structure in accordance with aspects of present technique.

FIG. 9 illustrates a partial cross-sectional view of an exemplary embodiment of a multi-layered support structure 142 of an open MRI system. As shown in FIG. 9, the structure includes a first plate 144 with a plurality of tapped holes, a second plate 146 with at a plurality of through-drilled holes aligned with the through-holes, a third plate 148 also with a plurality of through-drilled holes. The resulting structure may be joined by bolts, as discussed below.

For the illustrated arrangement, machining of the first plate 144 comprises finishing surfaces 150 and 152, preparing edge 154 for welding, providing tapped holes 156 and 158, and a through-drilled hole 160 for receiving a fastener. Machining of the second plate 146 comprises finishing surfaces 162 and 164, preparing edges 166 and 168 for welding and providing through-drilled holes 170, 172 and 174. Machining of the third plate 148 comprises finishing surfaces 176 and 178, preparing edge 180 for welding and providing through-drilled holes 182 and 184. Machining of a structure 186 comprises finishing a surface 188 and providing at least one tapped hole 190. Tapped hole 156 and through drilled hole 170 are configured to be aligned to each other during assembly. Similarly tapped hole 158 and through-drilled holes 172 and 182 are configured to be aligned to each other during assembly. Through-drilled holes 160, 174 and 184, and tapped hole 190 in the structure 186 are configured to be aligned to each other during assembly.

The plates are assembled so that surface 152 abuts surface 162, and surface 164 abuts surface 176. The first plate 144 and the second plate 146 are coupled using at least one fastener 192 extending into through-drilled hole 170 and tapped hole 156. The third plate 148 is coupled with the first plate 144 through the second plate 146 using at least one fastener 194 extending into through-drilled holes 172 and 182, and tapped hole 158. The first plate 144 and the second plate 146 are welded as shown by a weldment 196 between edges 154 and 166. Similarly the second plate 146 and the third plate 148 are welded as shown by weldment 198 between edges 168 and 180. As noted above, where such welding operations are performed, the multi-layered support structure 142 is further subjected to stress relieving through heat treatment. Final machining is performed to attain a desired configuration, which also includes preparing at least one hole 200 for a magnet assembly (not shown in FIG. 9), and finishing the surface 150. Finished multi-layered support structure 142 is coupled to the support structure 186 using at least one fastener 202 extending into through-drilled holes 160, 174 and 184, and tapped hole 190.

Figure 10:
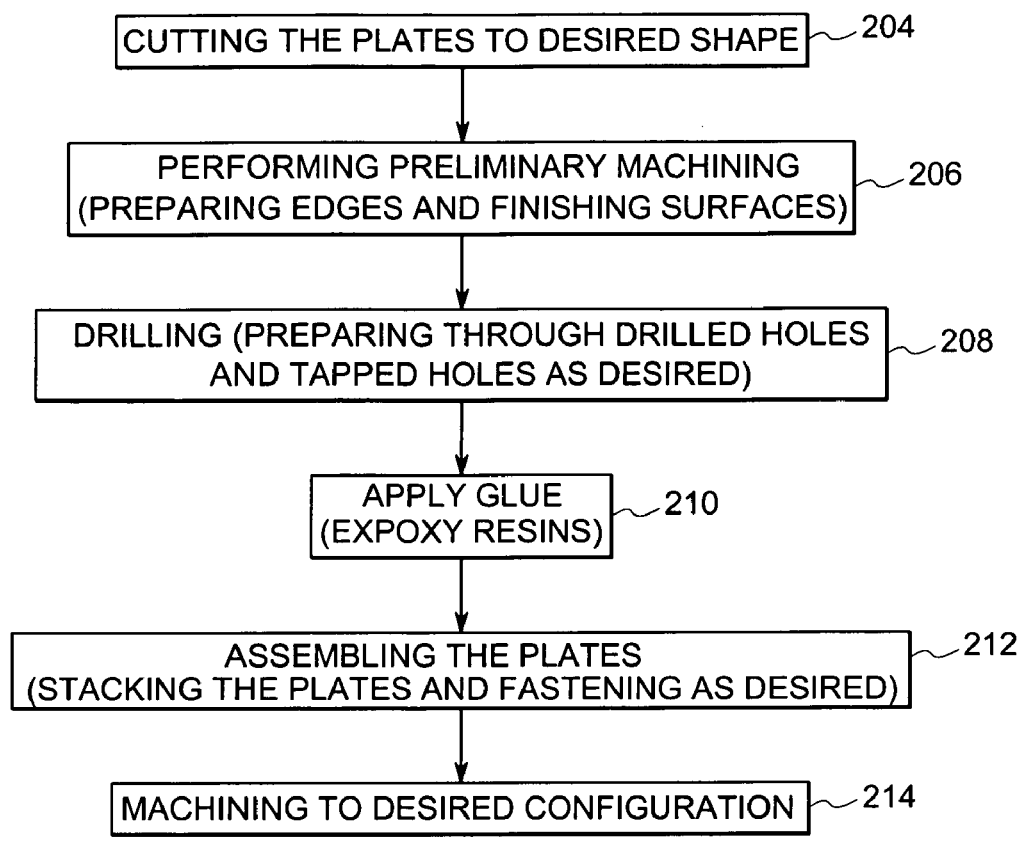
FIG. 10 is a diagrammatic illustration of an exemplary method of manufacturing of a multi-layered support structure in accordance with aspects of present technique.

FIG. 10 illustrates another exemplary method for manufacturing a multi-layered support structure for an open MRI system in accordance with aspects of the present technique. In the method of FIG. 10, a plurality of plates is cut to a desired shape, as indicated at step 204. A series of preliminary machining steps are then performed, as indicated at step 206, to prepare edges and surfaces. A plurality of through-drilled holes and a plurality of tapped holes are then formed in the plurality of plates, as indicated at step 208. An adhesive is then applied to the plates, as indicated at step 210. Any suitable adhesive may be employed for this purpose, such as glues comprising an epoxy resin. The plurality of plates is then assembled by stacking and fastening, as indicated at step 212. Such fastening may be used to complement the adhesive joining of the plates, to provide supplemental joining pressure, and to facilitate curing of the adhesive. Following assembly, machining operations may be performed on the plates to provide the desired final configuration, as indicated at step 214. Again, such machining operations will generally include preparing at least one hole for magnet assemblies.

Figure 11:
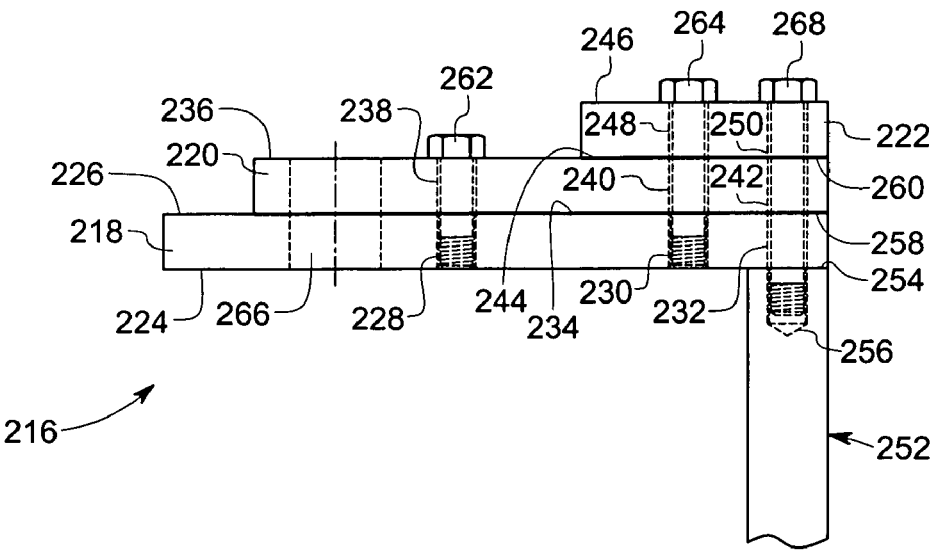
FIG. 11 is a front cross-sectional view of a top multi-layered support structure, which is bolted and bonded with an adhesive in accordance with aspects of present technique.

FIG. 11 illustrates an exemplary cross-sectional view of another exemplary embodiment of a multi-layered support structure 216 of an open MRI system. In the arrangement of FIG. 11, a first plate 218 is provided with a plurality of tapped holes and a through-drilled hole. A second plate 220 has a plurality of through-drilled holes that aligns with the holes of the other plates. Finally, a third plate 222 has with a plurality of through-drilled holes, also aligned with holes of the other plates to facilitate assembly of the plates via appropriate fasteners.

Machining of the first plate 218 comprises finishing surfaces 224 and 226, and forming tapped holes 228 and 230, and through-drilled hole 232. Machining of the second plate 220 comprises finishing surfaces 234 and 236, and forming through-drilled holes 238, 240 and 242. Machining of the third plate 222 comprises finishing surfaces 244 and 246, and forming through-drilled holes 248 and 250. Machining of a structure 252 comprises finishing a surface 254, and forming tapped hole 256. Tapped hole 228 and through drilled hole 238 are configured to be aligned with each other during assembly. Similarly tapped hole 230 and through-drilled holes 240 and 248 are configured to be aligned with each other during assembly. Through-drilled holes 232, 242 and 250, and tapped hole 256 in the structure 252 are configured with be aligned to each other during assembly.

A layer of suitable adhesive 258 is applied in an area common to surfaces 226 and 234. Similarly another layer of adhesive 260 is applied in an area common to surfaces 236 and 244. The plates are assembled so that surface 226 abuts surface 234, and surface 236 abuts surface 244. The first plate 218 and the second plate 220 are coupled using at least one fastener 262 extending into through-drilled hole 238 and tapped hole 228. The third plate 222 is coupled with the first plate 218 through the second plate 220 using at least one fastener 264 extending into through-drilled holes 240 and 248 and tapped hole 230. Machining is performed to attain a desired configuration, which also includes preparing at least one hole or recess 266 for a magnet assembly (not shown in FIG. 11), and finishing the surface 224. Finished multi-layered support structure 216 is coupled to the support structure 252 abutting the surfaces 224 and 254 using fasteners, such as fastener 268 shown in the figure extending into through-drilled holes 232, 242 and 250, and tapped hole 256.

Figure 12:
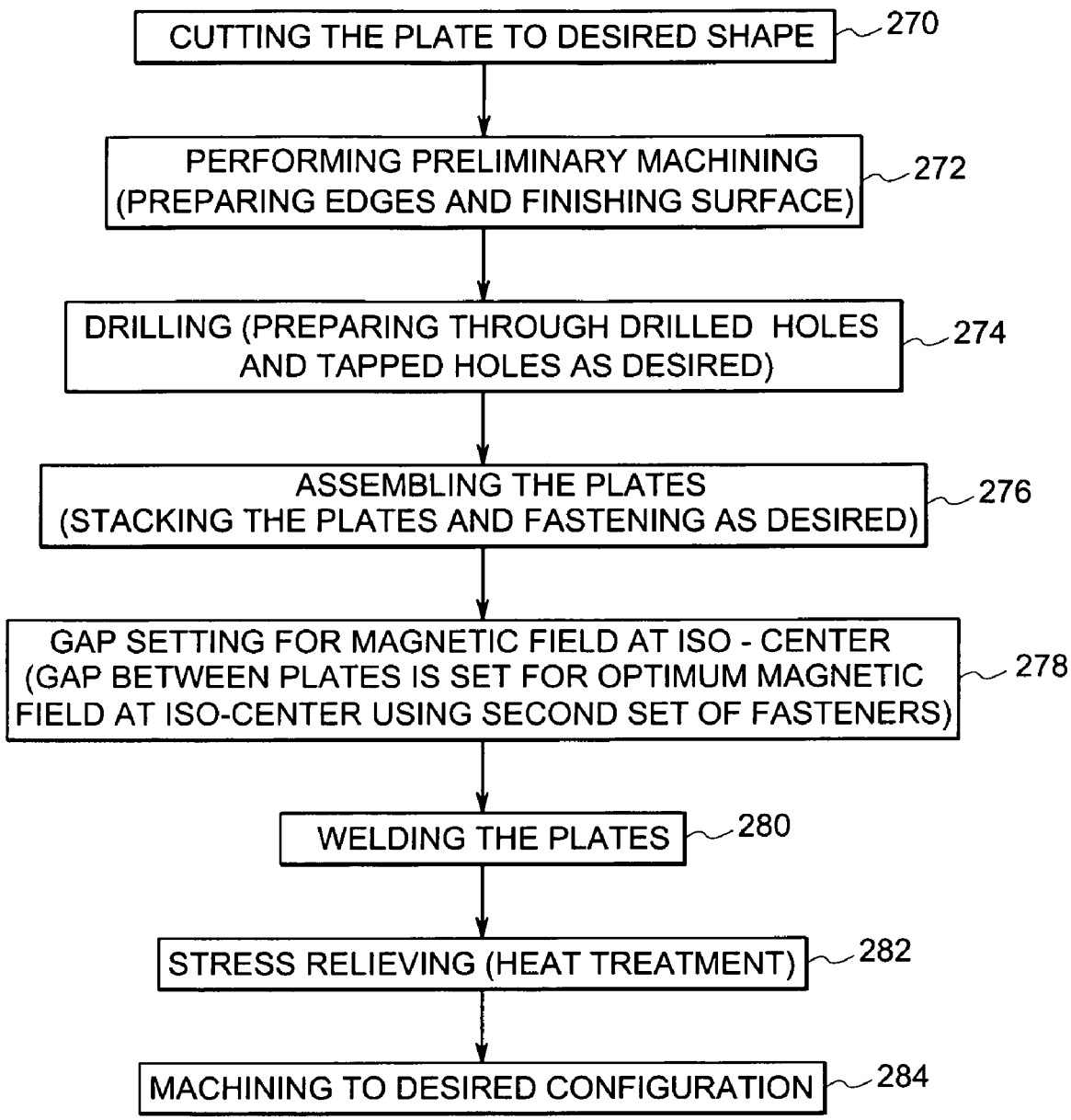
FIG. 12 is a diagrammatic illustration of an exemplary method of manufacturing of a multi-layered support structure in accordance with aspects of present technique.

FIG. 12 illustrates a yet another exemplary method for manufacturing a multi-layered support structure with a configuration that permits adjustment to tune the magnetic field of final open MRI system. In the exemplary method represented, a plurality of plates is first cut to a desired shape, as indicated at step 270. Preliminary machining steps are then performed, as indicated at step 272, such as to prepare edges and surfaces. A plurality of through-drilled holes and a plurality of tapped holes are then formed in the plurality of plates, as indicated at step 274. The plurality of plates is then assembled by stacking and fastening using fasteners, indicated at step 276. In this embodiment, at least one gap between the plurality of plates is then adjusted to correspondingly adjust the magnetic field that will be affected by the support structure, as indicated at step 278. Following adjustment of the gaps, the plates may be permanently joined, where desired, by welding, as indicated at step 280. Where such welding is performed, stress relieving may be performed through heat treatment, as indicated at step 282. Final machining may then be performed to provide the desired final configuration, as indicated at step 284. Here again, such machining will generally include preparing at least one hole or recess for magnet assemblies.

Figure 13:
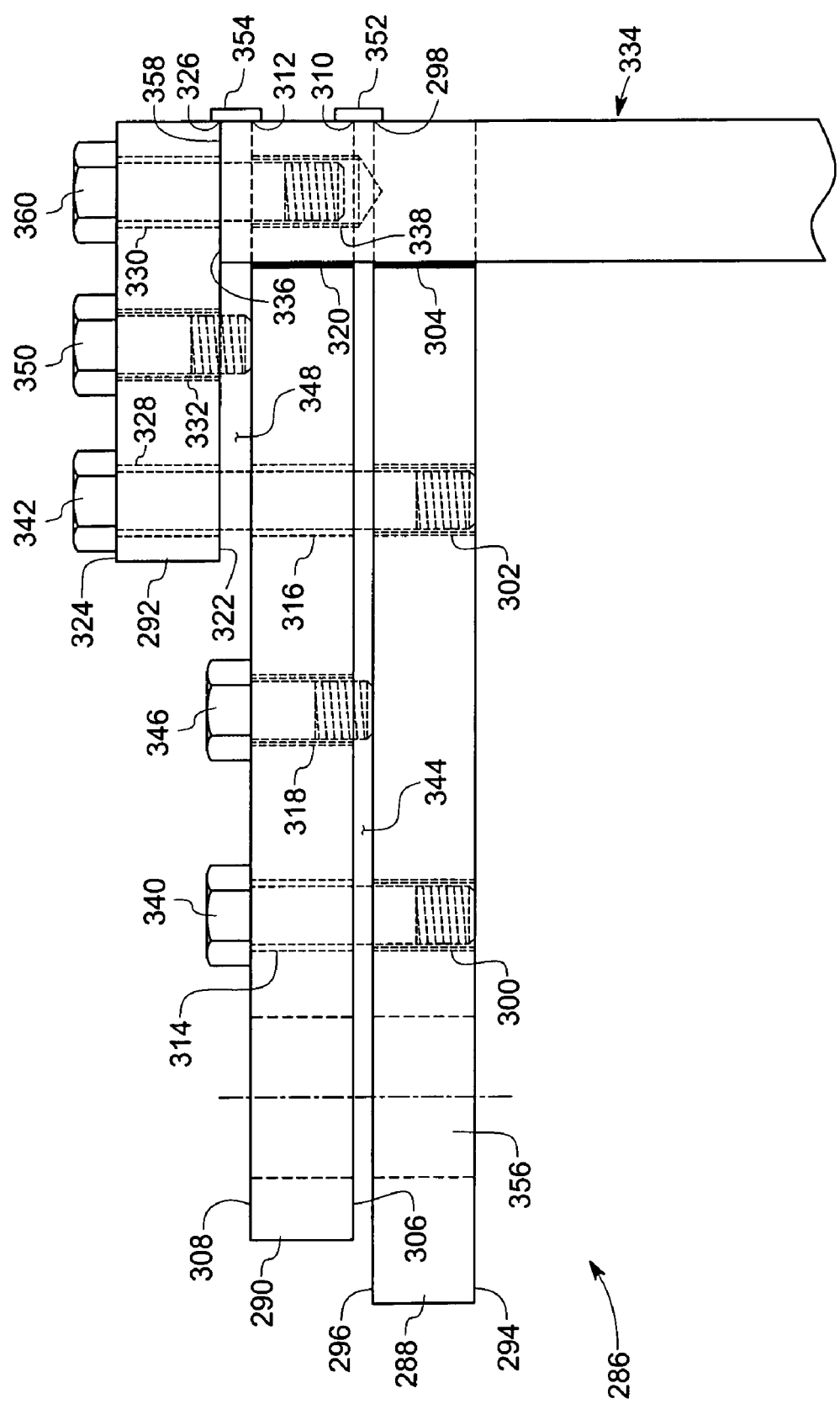
FIG. 13 is a front cross-sectional view of a top multi-layered support structure with provision for B0 adjustment in accordance with aspects of present technique.

FIG. 13 illustrates a cross-sectional view of yet another exemplary embodiment of a multi-layered support structure 286. The multi-layered support structure 286 is configurable to modify or adjust the influence on the magnetic field produced by the open MRI system to provide uniform magnetic fields for imaging. The multi-layered support structure 286 comprises a first plate 288 with a plurality of tapped holes. A second plate 290 has a tapped hole and a plurality of through-drilled holes. A third plate 292 similarly has a tapped hole and a plurality of through-drilled holes.

Machining of the first plate 288 comprises finishing surfaces 294 and 296, preparing edge 298 for welding, and forming tapped holes 300 and 302 and a cutout 304 (discussed below with reference to FIG. 14). Machining of the second plate 290 comprises finishing surfaces 306 and 308, preparing edges 310 and 312 for welding, and forming through-drilled holes 314 and 316, tapped hole 318 and a cutout 320 (discussed below). Machining of the third plate 292 comprises finishing surfaces 322 and 324 preparing edge 326 for welding, and forming through-drilled holes 328 and 330, and tapped hole 332. Machining of a structure 334 comprises finishing a surface 336, and providing at least one tapped hole 338. Tapped hole 300 and through drilled hole 314 are configured to be aligned with each other during assembly. Similarly tapped hole 302 and through-drilled holes 316 and 328 are configured to be aligned with each other during assembly. Through-drilled hole 330 and tapped hole 338 in the structure 334 are configured to be aligned with each other during assembly.

The plates are assembled so that surface 296 abuts surface 306, and surface 308 abuts surface 322. The first plate 288 and the second plate 290 are coupled using fasteners, such as fastener 340 shown, extending into through-drilled hole 314 and tapped hole 300. The third plate 292 is coupled with the first plate 288 through the second plate 290 using fasteners, such as fastener 342 extending through-drilled holes 316 and 328 and tapped hole 302. A gap 344 between the first plate 288 and the second plate 290 is adjusted using at least one fastener 346 in tapped hole 318. As can be seen in the figure, a lower portion of the fastener 338 touches surface 296 of the first plate 288 to permit adjustment of the gap there-between. Similarly a gap 348 between the second plate 290 and the third plate 292 is adjusted using at least one fastener 350 in tapped hole 332. Here again, a lower portion of the fastener 350 touches surface 308 of the second plate 290 to permit adjustment of the gap there-between.

It is believed that in current embodiments, an adjustment of each gap between 0.2 mm to 5 mm (total of 0.4 mm to 10 mm) results in an improvement of the resulting magnetic field in the final MRI system. In certain MRI systems a magnetic field may be adjusted by around 1.8% to provide a desired central magnetic field. Following such adjustment, the first plate 288 and the second plate 290 may be permanently welded together, as shown by weldment 352 between edges 298 and 310. The weldment 352 may be extended around the plate 290 for improving stability of the multi-layered support structure 286. Similarly the second plate 290 and the third plate 292 are welded as shown by weldment 354 between edges 312 and 326. As mentioned above, the weldment 354 may be extended around the plate 292 for improving stability of the multi-layered support structure 286. The multi-layered support structure 286 may then be subjected to stress relieving through heat treatment. Subsequently, final machining is performed to attain a desired configuration, which also includes preparing at least one hole or recess 356 for a magnet assembly. Finally, finishing of surfaces, such as surface 358 of the support structure 286 may be performed. Finished multi-layered support structure 286 is coupled to the structure 334 so that surface 358 of structure 286 abuts surface 336 of structure 334 using at least one fastener 360 connecting through-drilled hole 330 and tapped hole 338.

Figure 14:
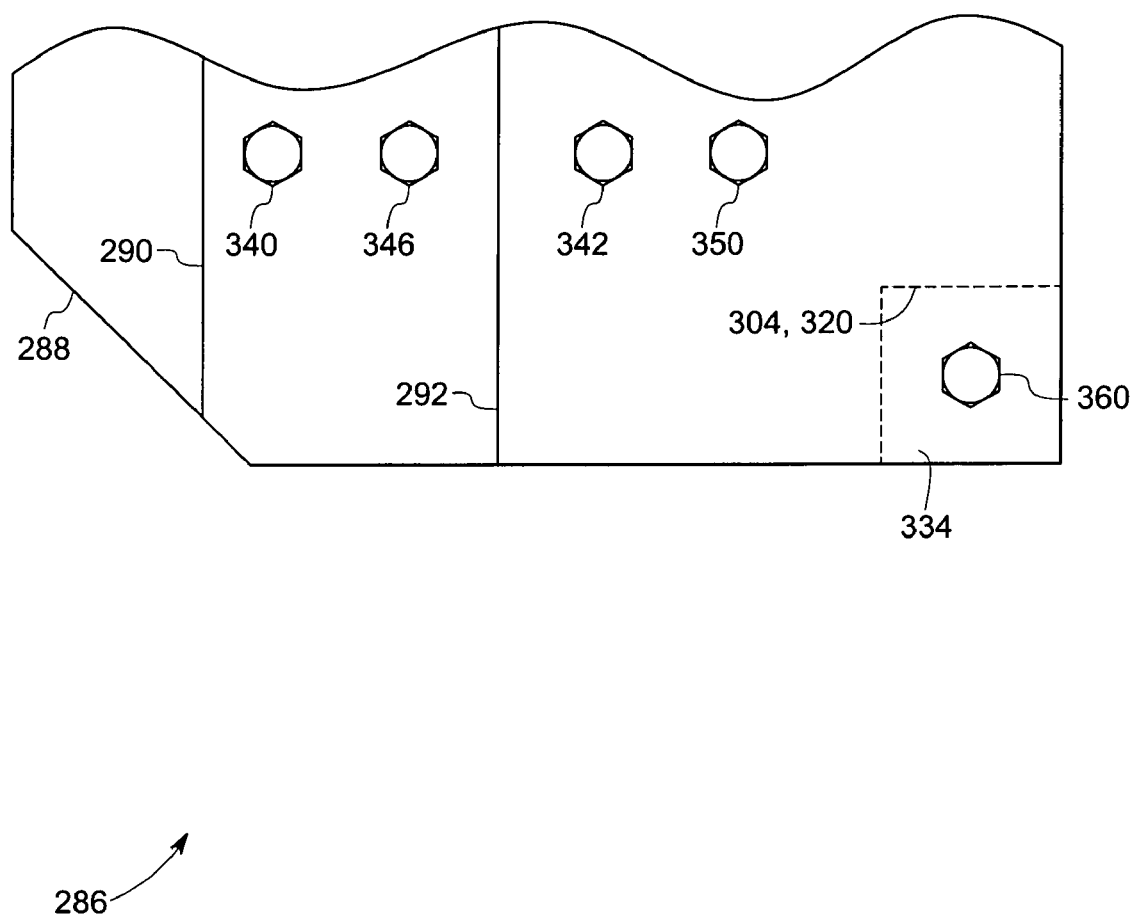
FIG. 14 is a top view of the top support structure of a multi-layered support structure with provision for B0 adjustment of FIG. 13.

FIG. 14 illustrates assembly of the multi-layered support structure 286 to the structure 334 of FIG. 13. The multi-layered support structure 286 includes the first plate 288 with the cutout 304, the second plate 290 with cutout 320, and the third plate 292. Fasteners 340 and 342 are provided, as mentioned above, for coupling the plates to one another, and fasteners 346 and 350 are provided for adjusting gaps between the plates. The cutouts are provided for assembling the support structure 286 to the structure 334, abutting surfaces 336 and 358 using the fastener 360.

Figure 15:
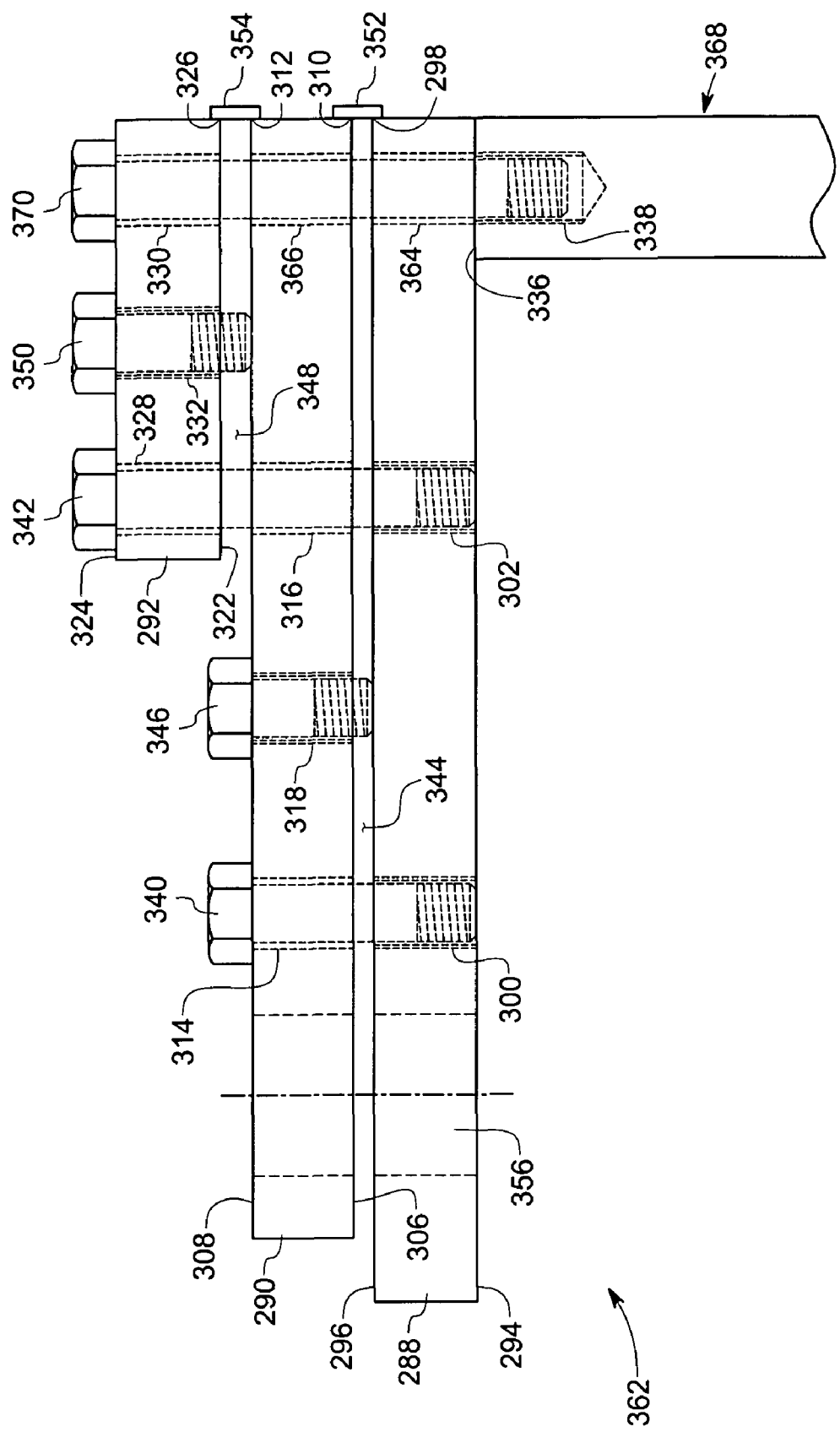
FIG. 15 is a front cross-sectional view of a top multi-layered support structure with provision for B0 adjustment in accordance with aspects of present technique.

FIG. 15 illustrates a cross-sectional view of yet another exemplary embodiment of a multi-layered support structure 362. The multi-layered support structure 362 can be configured to modify or adjust the influence on the magnetic field produced by the open MRI system to provide uniform magnetic fields for imaging. The multi-layered support structure 362 is similar in construction and in function to the multi-layered support structure 286 as illustrated in FIG. 13 and FIG. 14 and described previously. The first plate 288 is machined by finishing surfaces 294 and 296, preparing edge 298 for welding, forming tapped holes 300 and 302 and a preparing a through-drilled hole 364. Machining of the second plate 290 includes finishing surfaces 306 and 308, preparing edges 310 and 312 for welding, and forming through-drilled holes 314, 316 and 366 and a tapped hole 318. The third plate 292 is finished as explained in the previous embodiment. The multi-layered support structure 362 is finished substantially similar to the multi-layered support structure 286 as explained previously. However the multi-layered support structure 362 is assembled to a structure 368 by abutting the surfaces 336 and 294. Then the structures 362 and 368 are coupled using at least one fastener 370, which connects the through-drilled holes 330, 366 and 364 and the tapped hole 338 as depicted.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of manufacturing a support structure for a source of a magnetic field in a magnetic resonance imaging system, the method comprising:
   assembling a plurality of layers of a steel to form a first support structure;
   assembling a plurality of layers of a steel to form a second support structure;
   providing at least one of a plate and a post made of a steel to form a third support structure;
   assembling the first support structure, the second support structure and the third support structure, wherein the first support structure is associated with the second support structure through the third support structure; and
   adjusting at least one gap between the plurality of layers of at least one of the first support structure and the second support structure.

2. The method of claim 1, further comprising machining the plurality of layers of the first support structure and the second support structure.

3. The method of claim 1, further comprising providing a plurality of through-drilled holes, tapped holes and combinations thereof in the plurality of layers of the first support structure and the second support structure.

4. The method of claim 1, further comprising providing a plurality of tapped holes in the third support structure.

5. The method of claim 1, further comprising fastening the plurality of layers of the first support structure using at least one first fastener.

6. The method of claim 1, further comprising fastening the plurality of layers of the second support structure using at least one first fastener.

7. The method of claim 1, wherein adjusting the gap comprising using at least one second fastener in a tapped hole of a layer wherein a lower portion of the second fastener contacts a layer beneath it to permit adjustment of the gap.

8. The method of claim 1, further comprising welding the plurality of layers of the first support structure.

9. The method of claim 1, further comprising stress relieving the first support structure by a heat treatment process.

10. The method of claim 1, further comprising welding the plurality of layers of the second support structure.

11. The method of claim 1, further comprising stress relieving the second support structure by a heat treatment process.

12. The method of claim 1, further comprising machining the first support structure and the second support structure to a desired configuration.

13. The method of claim 1, comprising assembling the first support structure and the second support structure to the third support structure using at least one of a fastener, a welding, an adhesive and combinations thereof.

14. The method of claim 1, wherein the steel is a low carbon steel.

* * * * *

UNITED STATES PATENT AND TRADEMARK OFFICE
CERTIFICATE OF CORRECTION

PATENT NO.        : 7,802,354 B2
APPLICATION NO.   : 12/039647
DATED             : September 28, 2010
INVENTOR(S)       : Mao et al.

It is certified that error appears in the above-identified patent and that said Letters Patent is hereby corrected as shown below:

In Fig. 10, Sheet 8 of 12, for Tag "210", Line 2, delete "(EXPOXY" and insert -- (EPOXY --, therefor.

Signed and Sealed this

Twenty-third Day of November, 2010

David J. Kappos
*Director of the United States Patent and Trademark Office*